United States Patent [19]

Giebler et al.

[11] 4,241,333
[45] Dec. 23, 1980

[54] KEY-OPERATED ARRANGEMENT FOR PRODUCING CODE CHARACTERS

[75] Inventors: Fritz Giebler; Edmund Gensthaler, both of Munich, Fed. Rep. of Germany

[73] Assignee: Siemens Aktiengesellschaft, Berlin & Munich, Fed. Rep. of Germany

[21] Appl. No.: 833,916

[22] Filed: Sep. 16, 1977

Related U.S. Application Data

[63] Continuation of Ser. No. 695,822, Jun. 14, 1976, abandoned.

[30] Foreign Application Priority Data

Aug. 14, 1975 [DE] Fed. Rep. of Germany ....... 2336403

[51] Int. Cl.$^2$ ............................................... G06F 3/02
[52] U.S. Cl. ............................ 340/365 S; 178/17 C; 340/365 E
[58] Field of Search ............ 340/365 R, 365 E, 365 S; 364/706, 709; 178/17 A, 17 C; 400/479; 179/90 K

[56] References Cited

U.S. PATENT DOCUMENTS

| | | | |
|---|---|---|---|
| 3,645,441 | 2/1972 | De Sandre | 340/365 S |
| 3,760,409 | 9/1973 | Ruben et al. | 340/365 S |
| 3,786,497 | 1/1974 | Davis et al. | 340/365 S |
| 3,834,616 | 9/1974 | Washizuka et al. | 340/365 S |
| 3,886,539 | 5/1975 | Gould | 340/365 S |
| 3,911,424 | 10/1975 | Giannuzzi et al. | 364/706 |
| 4,124,843 | 11/1978 | Bramson et al. | 340/365 R |

FOREIGN PATENT DOCUMENTS 2153108 7/1974 Fed. Rep. of Germany .

OTHER PUBLICATIONS

"The Integrated Circuit Catalog", Texas Instruments, Dec. 1971, pp. 9-72 to 9-79.

Primary Examiner—John W. Caldwell, Sr.
Assistant Examiner—James J. Groody
Attorney, Agent, or Firm—Hill, Van Santen, Steadman, Chiara & Simpson

[57] ABSTRACT

A key-operated arrangement for teleprinters as a keyboard for encoding characters and data arranged in matrix fashion in rows and columns. Along with the keyboard an addressable fixed-value store is provided. A scanning device periodically scans the keyboard and fixed-value store and produces a coded character from the store when a signal is present which is provided by operation of a contact on the keyboard. At least one additional matrix column is arranged on the keyboard for special functions. A mode register connected via a column selector to the additional matrix column stores signals arriving from the scanning device and converts them into control signals which appear in parallel at outputs of the mode register.

2 Claims, 1 Drawing Figure

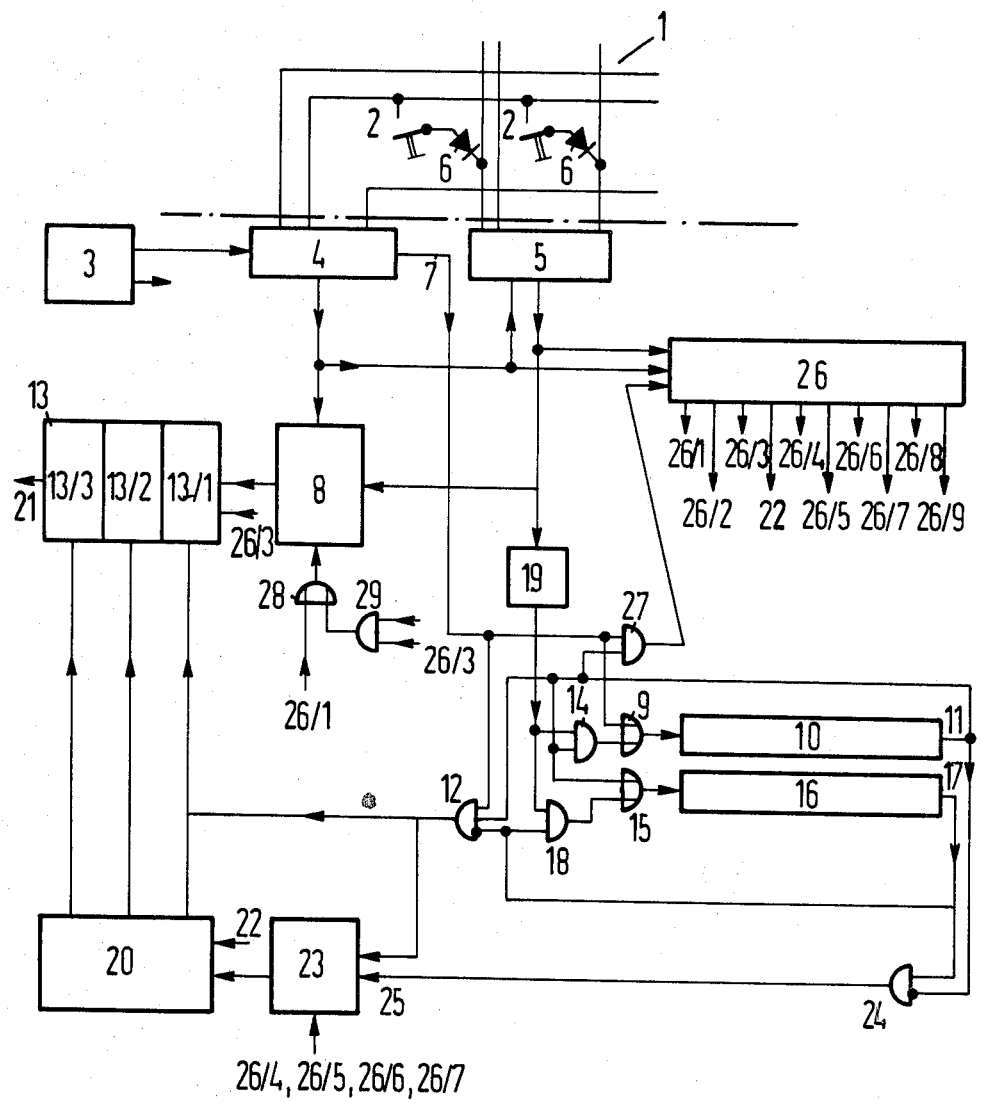

KEY-OPERATED ARRANGEMENT FOR PRODUCING CODE CHARACTERS

This is a continuation of application Ser. No. 695,822, filed June 14, 1976, now abandoned.

BACKGROUND OF THE INVENTION

1. Field of the Invention

The present invention relates to a key-operated arrangement, and more particularly to an arrangement for teleprinters.

2. Description of the Prior Art

Key-operated arrangements encode characters and data with the help of a keyboard arranged in matrix fashion in rows and columns and using an addressable fixed-value store and a scanner device which periodically scans the keyboard by row and column lines and the fixed-value store by row and column lines. If a signal produced by the operation of a key in the keyboard is present, the scanner device produces the coded character corresponding to this key from the store.

In modern keyboards for electronic teleprinters, complete electronic control is carried out in a highly integrated MOS module. The mechanical portion is generally restricted to a key matrix with a key and associated make contact which connects a diode at the particular matrix point. In order to make this kind of highly integrated MOS module as versatile in application as possible, this kind of keyboard module must incorporate virtually all the functions which are likely to occur within a wide range of applications. Naturally, driving of this kind of module through a restricted (because of the sizes involved) number of connecting pins (which results because of the sizes involved) constitutes a major problem. The layout of this kind of module must be so designed that it can be driven using the minimum number of connecting pins.

The heart of a finished keyboard module consists of a character store which is generally designed to have several levels and contains the characters which can be called up by means of keys. In this context (as known from German Letters Patent No. 2 153 108) the keyboard matrix is periodically scanned by a counter device and, if there is a closed key, the data corresponding to the key is prepared in the store. In the particular case of a teleprinter, this means that with actuation of a key, the stored data corresponding to the character is supplied to the teleprinter transmitter. This data is, of course, coded in accordance with the particular code being used.

SUMMARY OF THE INVENTION

The object of the present invention is to provide, particularly for teleprinters, a key-operated arrangement for the encoding of characters and data, by means of which it is possible, for a minimum number of connection pins, to service a maximum number of function-triggering keys. It is also desirable to provide an arrangement in which it is simple to arbitrarily repeat characters called up by means of keys and to form series of several characters which can then be repeatedly called up.

In accordance with the invention, the above objects are achieved by providing a keyboard in which there is at least one additional matrix column which can be freely programmed by means of keys or fixed connections. The signal from the additional matrix column of the keyboard is connected via a column selector (through one column line) and row selector (through ten row lines) to a mode register which, in the rhythm of the sampling cycle, stores serially arriving signals and converts them into control signals which are applied in parallel at the outputs of the register. The term "mode register" is intended to signify a register for storing control commands and which converts dynamic signals into static signals.

By simply expanding the keyboard matrix by one extra matrix column, it is possible in accordance with the invention and in accordance with the size of the matrix involved, to provide additional keys which, for example, trigger special control characters peculiar to the particular user, and which can be addressed commonly via one connecting pin. Instead of the keys, it is of course also possible in accordance with the invention to provide fixed conductive bridges. The invention further makes it possible, by utilizing a scanning principle which economizes on connecting pins, to trigger via keys or conductive bridges static, state-determined control signals. These control signals have signal levels which do not change over a long period of time.

In order to enable arbitrary characters to be repeated in a simple fashion, in one advantageous embodiment a multi-stage output register follows the fixed-value store. This register receives the characters issuing from the store in the sequence of transmission, the last character received in this way remaining stored in the first stage of the transfer register when the character flow is interrupted so that this character can be transmitted at a variable recurrence frequency by triggering a repeat key.

In another advantageous embodiment, the repeating of a specific character is simplified by virtue of the fact that, preferably, the keys triggering alphanumeric characters are coupled to a timer stage, which, depending upon the time of actuation of the keys, acts through the output register to initiate repetition of the transmission of the character assigned to the key.

BRIEF DESCRIPTION OF THE DRAWING

The FIGURE illustrates a block circuit diagram of the arrangement in accordance with the invention.

DESCRIPTION OF THE PREFERRED EMBODIMENTS

A keyboard in the form of a keybank 1, for the feeding in of data and characters, consists of a contact matrix made up of ten plus ten lines with associated keyboard electronics. Here, each key is coupled in the keyboard with a contact 2 in each case located at the points of intersection of the keyboard matrix. After depression of a key, a row selector 4 controlled by a pulse generator 3 runs through at a frequency of about 66 kilohertz and successively samples the rows 1 to 10 of the keyboard 1. After each pass by the row selector, a column selector 5 is then advanced one column. When the complete matrix has been sampled, the sampling cycle is concluded. If a closed key is encountered, the zero potential at the output of the column selector 5 is transmitted via the diodes 6 arranged at the points of intersection of the matrix and the closed keys, to the corresponding input of the row selector 4. This row selector then produces at the output 7 a signal which will be referred to in abbreviated form as the triggering signal. At the same time via the pulse generator 3 the storage positions in a character store 8 are addressed.

Therefore, during sampling of a key in the keyboard 1 the corresponding character is simultaneously prepared at the output of the character store.

When sampling the keyboard in order to provide protection against the effects of contact bounce in the switching contacts of the keyboard 1 and at the same time to ensure that when the key remains depressed for a lengthy period of time that the same character is not periodically retransmitted, special circuit measures are taken within the keyboard electronic system.

If, for example, a triggering signal is present at the output of the row selector 4, i.e. if a depressed key has been encountered, then this triggering signal is fed via a NOR-gate 9 into a shift register 10 and shifted through at the sampling frequency. Consequently, this data signal, after the end of a sampling cycle, reappears at the output 11 of the shift register. If, at this instant, the key is still depressed, then the row selector 4 puts out a new triggering signal via the output 7. Together with the signal appearing at the output 11 of the shift register 10 and stemming from the first sample cycle, a pulse is produced via an AND-gate 12 which brings about transfer of the character appearing at the output of the character store 8 to an output register 13 and also causes the ensuing transmission of this character. At the same time, the same triggering signal is injected back into the shift register 10 via a further AND-gate 14. In addition, by way of an indication that the character has been transmitted, the triggering signal is injected via a NOR-gate 15 into a further shift register 16 and shifted through the same at the sampling frequency. Consequently, after the next sampling cycle, at the output 17 of the shift register 16 the triggering signal appears and is re-injected into the shift register 16 via an AND-gate 18. Because the triggering signal is also present at the negated input of the AND-gate 12, repetition of the transfer pulse is consequently inhibited.

The erasing of the triggering signal inside the shift registers 10 and 16 for the purpose of enabling renewed transfer of the same character is only possible after the opening of the corresponding key contact and the elapse of a time period of about 30 to 60 milliseconds by an anti-bounce timer stage 19 arranged between the columns selector 5 and the shift registers. For this purpose, every 30 milliseconds the AND-gates 14 and 18 are blocked for the duration of a sampling cycle. If, during this sampling cycle, no new triggering signal arrives from the row selector because the key has meanwhile been released, no new signal is injected into the shift register 10. The shift register 16 receives the signal produced from the output of the shift register 10 via the NOR-gate 15, and is therefore not yet erased. Only after a further 30 milliseconds is the pulse in the shift register 16 erased since the anti-bounce timer stage 19 blocks the AND-gate 18 where, from the shift register 10, a fresh pulse is present at the shift register 16. If, from this moment on, the same key is depressed again, a fresh transfer pulse can be generated.

In the presence of a transfer pulse at the output of the AND-gate 12, the three-stage output register 13 receives the character appearing at the output of the character store 8 and shifts it under the control of a call-up control unit 20, through the registers 13/2 and 13/3 to the output 21 of the output register 13. If, then, a further character is called up from the character store 8, then the control unit shifts it through the individual register 13/1 only as far as 13/2. With depression of a further key, the individual register 13/1 is then also filled. Further characters are not stored in the output register 13. With call-up from the output 21, however, following characters are correspondingly shifted onwards in the output register 13.

In any event, with an interruption in the data flow at the output of the character store 8, the character last transferred from the store 8 and transmitted at output 21 remains in the register 13/1 and can therefore be repeatedly transmitted as often as required by means of a repetition pulse 22 triggered by a repeat key. In accordance with the arrangement of the invention, the repetition of a character can also be triggered by continuous actuation of the associated key. This feature can be assigned to each key or only to specific keys by a marking in the ninth bit of the character. In detail, what happens is as follows. With each transfer pulse in the control unit 23 a timer stage incorporated there is triggered. This timer stage is reset by an AND-gate 24 (input 25) when the triggering pulse has been erased in the shift register 10 but is still present at the output 17 of the shift register 16. If this resetting does not take place within a time 26/4, 26/5, which is adjustable for the repetition 23 via the input of the control arrangement, then the latter supplies repeat pulses to the call-up control 20 and the frequency of these repeat pulses is also variable (26/6, 26/7).

Transmitted characters peculiar to the user or other special characters are generally produced in teleprinters by special keys arranged in the keyboard. These keys are connected individually to the character store, i.e. for each key, and, generally, speaking, a special lead to the character store is required. In order to enable the character store to perform as many special functions as possible, despite a limited number of connecting pins, special measures were adopted in the arrangement of this invention. Within the keyboard comprising ten by nine keys, an additional tenth column line was added to the nine by ten matrix, making ten additional special functions possible, these being generated by a mode register 26 and stored in the mode register. It is possible in this way to arrange these keys for special functions within the keyboard and to sample them in pulse fashion as above. These dynamic signals, produced by the depression of a special function key, are converted by the mode register into static signals.

The mode register itself consists of a ten-bit selecctor 40 (sampling device), and ten storage trigger stages 41 connected in parallel therewith. With sampling of the tenth column in the keyboard, any triggering pulses which happen to have been produced by the depression of a key are directed via the AND-gate 27 into the trigger stages of the ten-bit selector. In this way, the mode register generates the static control signals required to drive the character store and the input/output registers. In detail, the following special functions can be generated: 26/1 "shift"; 26/2 "shiftlock"; 26/3 "control"; 22 repetition of called up characters; 26/4 and 26/5 the variable waiting times introduced by the automatic system already described for the repetition of characters; 26/6 and 26/7 the associated repetition frequencies; 26/8 the driving of the character levels within the character store to switch the keyboard from the national to the international standard, for example; and 26/9 the facility to repeat all characters in the ninth bit irrespective of whether or not they are specially identified (as already described.)

Because the character store only has four true storage levels with two times two times ninety times ten bits, two additional phanton levels containing control characters are created by virtue of the fact that the sixth and seventh bits of the corresponding character assigned to the key and stored in the fixed-value store are re-coded in accordance with the control characters (code table CCITT Number 5). This re-coding is triggered by operation of the "control" key. The requisite switching function is performed in register 13/1. Thus, these control characters need not be stored in the fixed-store. Therefore, via the outputs 26/1 and 26/8 of the mode register 26, the true character levels are driven while the driving of the phantom levels is performed using the control key 26/3.

Because the specific control functions preferably take the form of control character combinations as, for example, carriage return/line feed, to increase the ease of operation, special circuitry has been adopted to permit the formation of character series. This formation takes place within the output register 13. If, for example, a character series is called up, then the relevant character receives an appropriate marking from the store by use of a triggering character in the tenth bit and one of two other possible characters is arranged in front of it.

In accordance with the character series which is to be called up, a distinction is made between control characters (columns 0 and 1 Code Tables CCITT Nr. 5) and alphanumeric characters. If, for example, a character series is called up by using control characters, then marking of the called up character, e.g. "line-feed", occurs in the tenth bit. This automatically codes the third register of the output register 13 for the character "CR" (carriage return) and this character is therefore transmitted before the "line feed" control character. If a character series is involved which commences with an alphanumeric character, then this alphanumeric character, which is also marked in the tenth bit, is preceded by the character "ESC". Thus, character series such as "carriage return/line feed" (CR/LF) and "shift/figures" (ESC/figures") are possible. Because, as already described, the last character always remains stored in register No. 1 of the output register 13 of the store, it is possible by continuous actuation of the corresponding keys to repeat transmit the character series as well.

Although various minor modifications may be suggested by those versed in the art, it should be understood that we wish to embody within the scope of the patent warranted hereon, all such embodiments as reasonably and properly come within the scope of our contribution to the art.

We claim as our invention:

1. A key-operated arrangement in particular for teleprinters, comprising:
   (a) a keyboard to encode characters and data arranged in matrix fashion in rows and columns, each character being electrically accessed by row and column selector lines;
   (b) an addressable fixed-value store comprising an integrated module;
   (c) a row and column scanning device means for creating sampling signals for periodically scanning the keyboard via the selector lines and also scanning the fixed-value store and producing a coded character from said store when a signal is present produced by the operation of a keyboard contact on said keyboard, the device means also producing a dynamic short time-period trigger signal corresponding to depression of a key in the keyboard;
   (d) at least one additional special function key matrix column on said keyboard having keyboard contacts in said keyboard, the additional column also being scanned by the scanning device means;
   (e) a mode register connected to receive the trigger signals and also the sampling signals from all the rows and the additional matrix column, said mode register comprising means for selecting and providing a static special function state-determined control signal corresponding to a depressed special function key and in response to the dynamic trigger signal outputting the static control signal having a relatively long time period in parallel at outputs of the mode register; and
   (f) special function circuitry connected to the special function control signals, whereby the additional column of special function keys is provided without expanding the fixed-value store to provide static control signals for the special functions.

2. An arrangement of claim 1 in which said keyboard contacts comprise bridge circuits.

* * * * *